United States Patent [19]

Bauck

[11] Patent Number: 4,678,987
[45] Date of Patent: Jul. 7, 1987

[54] FEATURE EXTRACTOR FOR QUASI-PERIODIC SIGNALS

[75] Inventor: Jerald L. Bauck, Urbana, Ill.

[73] Assignee: Motorola Inc., Schaumburg, Ill.

[21] Appl. No.: 784,970

[22] Filed: Oct. 7, 1985

[51] Int. Cl.$^4$ .................................................. G01R 23/16
[52] U.S. Cl. ............................... 324/77 R; 324/77 B; 324/78 D
[58] Field of Search ................ 324/77 R, 77 A, 77 B, 324/77 D, 77 E, 77 F, 78 R, 78 D, 78 F, 79 R, 79 D, 84, 85, 337; 358/310, 322

[56] References Cited

U.S. PATENT DOCUMENTS

| | | | |
|---|---|---|---|
| 4,270,150 | 5/1981 | Diermann | 358/322 |
| 4,351,216 | 9/1982 | Hamm | 324/77 A |
| 4,415,854 | 11/1983 | Remy | 324/84 |
| 4,504,833 | 3/1985 | Fowler et al. | 324/337 |
| 4,514,769 | 4/1985 | Gallo | 358/310 |

Primary Examiner—Michael J. Tokar
Attorney, Agent, or Firm—E. A. Parsons

[57] ABSTRACT

The purpose of the disclosed structure is to extract features from the emissions of quasi-periodic signal sources, such as piston engine powered vehicles and the like, after which pattern classification can proceed by any of a number of known methods. The structure consists of a phase locked loop, a bank of discrete-time filters, and a microcomputer. The filter bank is tuned by changing the clock rates, which are derived from the phase locked loop, which is locked to the signal fundamental frequency. The microcomputer is used to acquire the fundamental frequency and the filter tuning is such that each filter tracks a single harmonic.

8 Claims, 5 Drawing Figures

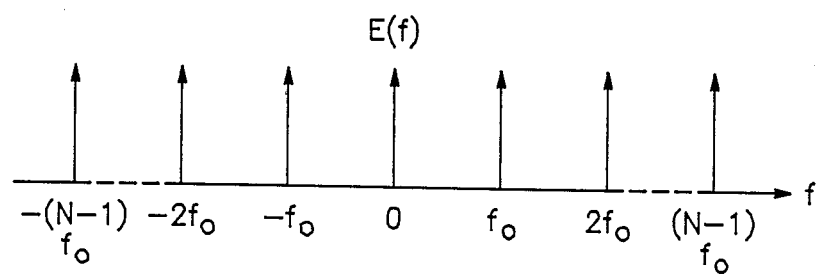
FIG. 1
FIG. 3
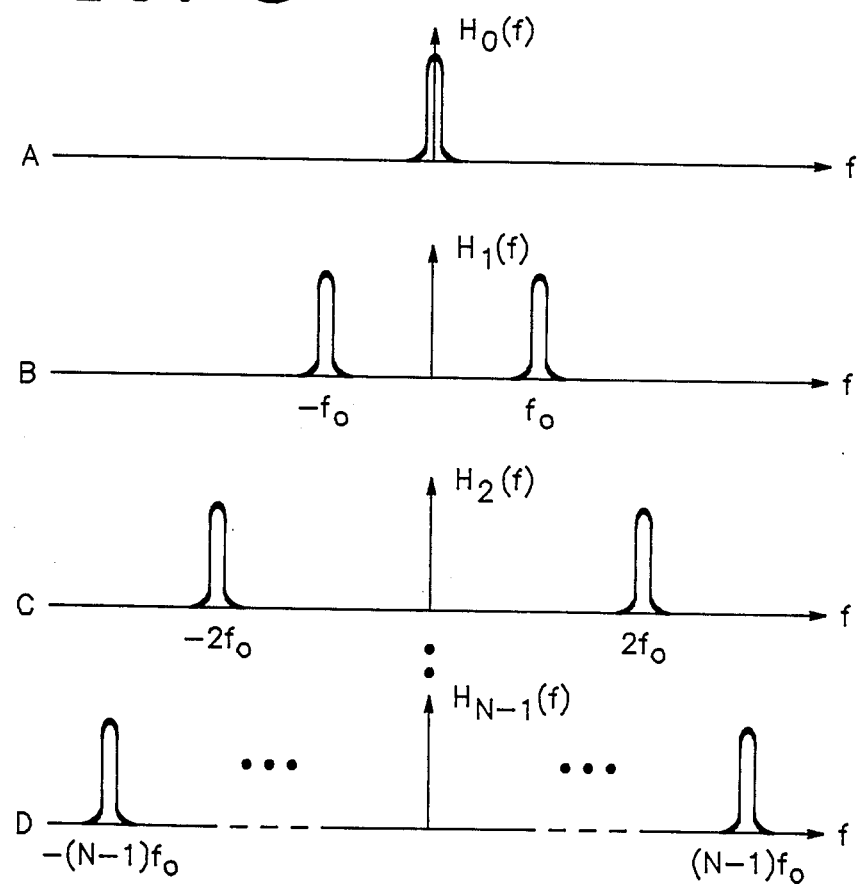

FEATURE EXTRACTOR FOR QUASI-PERIODIC SIGNALS

BACKGROUND OF THE INVENTION

In many applications it is desirable to characterize quasi-periodic signals. Quasi-periodic signals may be produced from a variety of sources, one principle source being piston engines or vehicles driven by piston engines. One way of characterizing (i.e. extracting features) the source or vehicle is to find the amplitude of the base frequency and the various harmonics making up the quasi-perodic signal. Once the quasi-periodic signal is characterized, the quasi-periodic signal can be compared to known signals, through standard pattern classification techniques, to identify the source of the quasi-periodic signal.

Generally, when sources of quasi-periodic signals, such as piston engines and the like, vary in speed, traveling conditions, etc. the base frequency (piston firing rate) and harmonics vary so that the characteristic pattern of the source varies. In the prior art, discrete-time spectrum analyzers are utilized in conjunction with a fixed clock frequency to analyze quasi-perodic signals. The problem with this type of analysis is that when conditions of the source are altered (speed, terrain, etc.) the base frequency and harmonics of the quasi-periodic signal are altered and the analysis can no longer be compared to a predetermined pattern.

SUMMARY OF THE INVENTION

The present invention pertains to a method and a feature extractor for determining amplitudes of a base frequency and harmonics in a received quasi-perodic signal. The feature extractor includes base frequency generating means connected to receive the quasi-periodic signal and generate a base frequency signal therefrom, a harmonic synthesizer connected to receive the generated base frequency signal and generate a plurality of harmonic frequency signals therefrom, and a plurality of clocked bandpass filters each connected to receive the quasi-periodic signal and each receiving a different one of the base frequency signal and harmonics for clocking the bandpass filters so that each of locked to a different one of the fundamental frequency and harmonics and produces an indication of the amplitude thereof at an output.

It is an object of the present invention to provide a new and improved feature extractor.

It is a further object of the present invention to provide a new and improved feature extractor for determining amplitudes of a fundamental and a plurality of harmonics of a quasi-periodic signal.

It is a further object of the present invention to provide a new and improved method of extracting features of a quasi-periodic signal.

These and other objects of this invention will become apparent to those skilled in the art upon consideration of the accompanying specification, claims and drawings.

BRIEF DESCRIPTION OF THE DRAWINGS

Referring to the drawings,

FIG. 1 graphically illustrates the spectrum of a quasi-periodic signal;

FIG. 3 is a graphic representation of the frequency responses of filters of FIG. 2;

DESCRIPTION OF THE PREFERRED EMBODIMENT

Referring to the FIG.S, a typical quasi-periodic signal as referred to in this disclosure will have a spectrum generally as illustrated in FIG. 1. Assuming that the quasi-periodic signal is generated by a piston driven engine, the spectrum illustrated in FIG. 1 is correct when the engine is running at a constant speed. The engine signal component is best modeled as having discrete harmonics which shift slowly with engine speed. While the harmonics in FIG. 1 are all illustrated as having approximately the same amplitude, it should be noted that the spectra of typical piston driven engines normally decays so that there are only five to twenty significant harmonics. In FIG. 1, $f_o$ is the piston firing rate, or the fundamental frequency of the quasi-periodic signal, and the amplitude of the harmonics generally will depend on vehicle or engine structure and where the spectrum is recorded.

Figure 2:
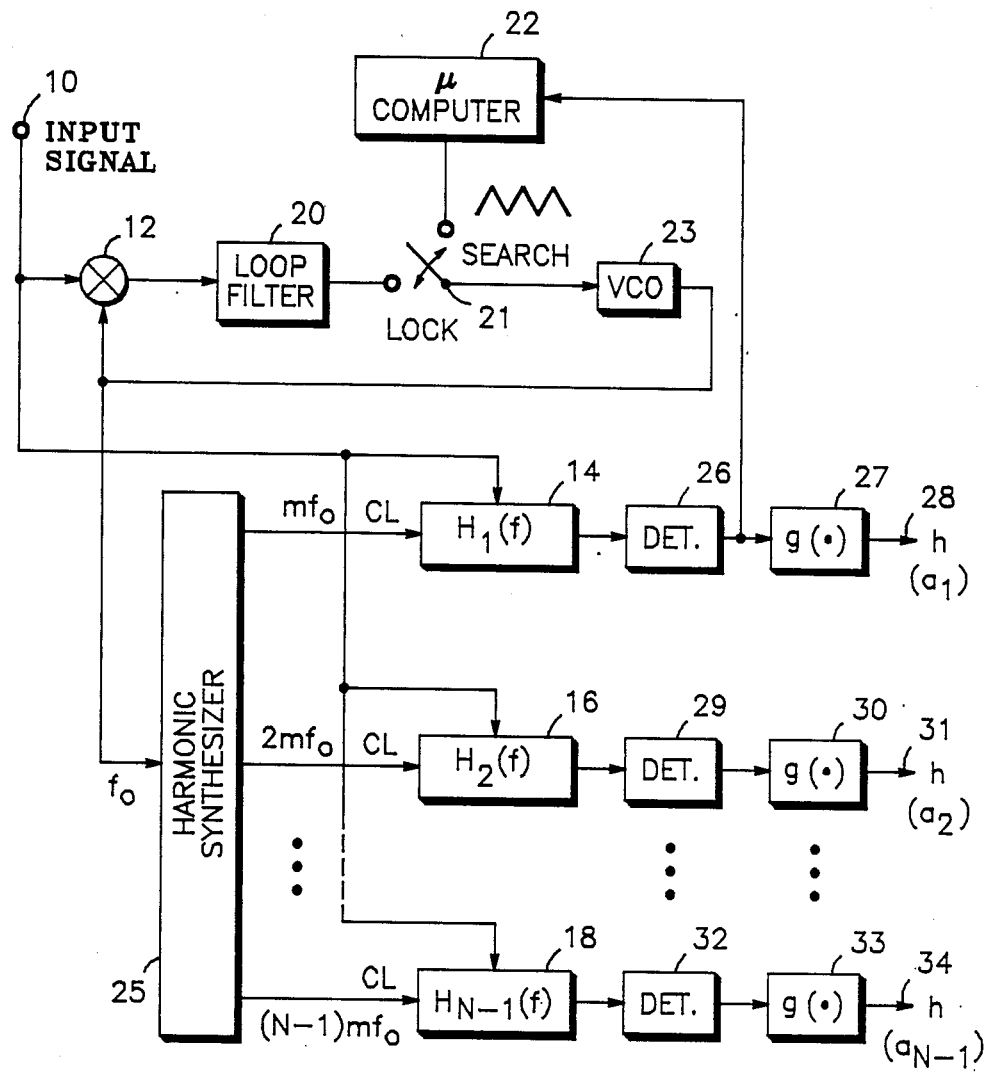
FIG. 2 is a simplified block diagram of a feature extractor embodying the present invention.

Referring to FIG. 2, a simplified block diagram of a feature extractor capable of characterizing quasi-periodic signals is illustrated. The number 10 indicates a signal input terminal adapted to have a quasi-periodic signal applied thereto. The signal applied to terminal 10 is supplied to one input of a phase detector 12 and to the signal inputs of a bank of discrete-time filters 14, 16, and 18. The output of phase detector 12 is supplied through a loop filter 20 to the lock input of a switch 21. A search input of switch 21 is connected to a microcomputer 22, which microcomputer also operates switch 21. Switch 21 provides an input signal to the control terminal of a voltage controlled oscillator 23, the output of which is supplied to a second input of phase detector 12, to complete a phase locked loop. The output of oscillator 23 is also supplied to an input of a harmonic synthesizer 25. A first output of harmonic synthesizer 25 is supplied to a clock input of filter 14, a second output is supplied to a clock input of filter 16, and an (N−1) output is supplied to a clock input of filter 18. The output of filter 14 is connected through a detector 26 and an arbitrary function box 27 to an output terminal 28. The output terminal of filter 16 is connected through a detector 29 and arbitrary function box 30 to an output terminal 31. The signal output of filter 18 is connected through a detector 32 and arbitrary function box 33 to an output terminal 34. The output of detector 26 is also connected to an input of microcomputer 22.

One way of extracting features from a quasi-periodic signal is to find the coefficients, or amplitude, of the fundamental frequency and the harmonics thereof. In the present invention, this is accomplished by using the bank of discrete-time bandpass filters 14, 16, and 18. In the operations of the circuit of FIG. 2, a quasi-periodic signal is applied to input terminal 10. Because detector 26 does not have an output at this time, the signal supplied to microcomputer 22 causes microcomputer 22 to place switch 21 in the search position. In the search position, microcomputer 22 supplies sawtooth voltage waves to the control input of voltage control oscillator 23 to cause the oscillator to sweep through its range of operation. When the frequency of oscillator 23 compares in phase to the fundamental frequency of the quasi-periodic signal applied to terminal 10, an output signal is supplied by filter 14 through detector 26 to microcomputer 22 which causes the microcomputer to move switch 21 to the lock position. Moving switch 21 to the lock position completes the phase locked loop and locks it onto the fundamental frequency. This fundamental frequency is supplied to harmonic synthesizer 25.

In the present embodiment filters 14, 16 and 18 can be, for example, switched capacitor filters which typically require that the clock frequency applied thereto be greater than the fundamental frequency by a factor of m. In this embodiment the factor m is a multiplying factor in harmonic synthesizer 25. Thus, the output supplied to the clock input of filter 14 is m times the fundamental while the output supplied to the clock input of filter 16 is 2m times the fundamental and the output supplied to the clock input of filter 18 is $(N-1)$ m times the fundamental frequency. The filters 14, 16, and 18 are discrete-time bandpass filters which pass only the frequency commensurate with the clocking rate as illustrates by the frequency response graphically illustrated in FIGS. 3(A), (B), (C), and (D). If, for example, filter 14 is clocked at the rate of the fundamental frequency it will pass only the fundamental frequency. Further, if the fundamental frequency varies and the clocking rate is varied in accordance with the fundamental frequency variations, the filter will track the fundamental frequency. Since discrete-time bandpass filters are well known in the art, the construction of a specific type will not be further elaborated upon.

Each of the filters 14, 16, and 18 are clocked with signals generated from the quasi-periodic signal being processed. Thus, filter 14 tracks the fundamental frequency, filter 16 tracks the second harmonic, and filter 18 tracks the $(N-1)$ harmonic of the quasi-periodic signal applied to input terminal 10. Since the phase locked loop tracks the input signal the fundamental frequency at the output thereof is always synchronized with the fundamental frequency of the quasi-periodic signal input. Further, the outputs of harmonic synthesizer 25 are all synchronized with the fundamental and harmonics of the quasi-periodic signal supplied to input terminal 10 to provide the tracking feature. The outputs of filters 14, 16, and 18 are appropriately detected in detectors 26, 29 and 32 and the detected signals are applied to boxes 27, 30 and 33. Boxes 27, 30 and 33 perform arbitrary functions on the detector outputs and are optional circuits that may not be required in many applications. An example of an arbitrary function is to provide the inverse of a non-linear detector (e.g. square-law) in which case the output at terminal 28 is a direct reading of the amplitude of the fundamental frequency. It will of course be understood that many other types of amplitude or coefficient indicators might be utilized by those skilled in the art.

Figure 4:
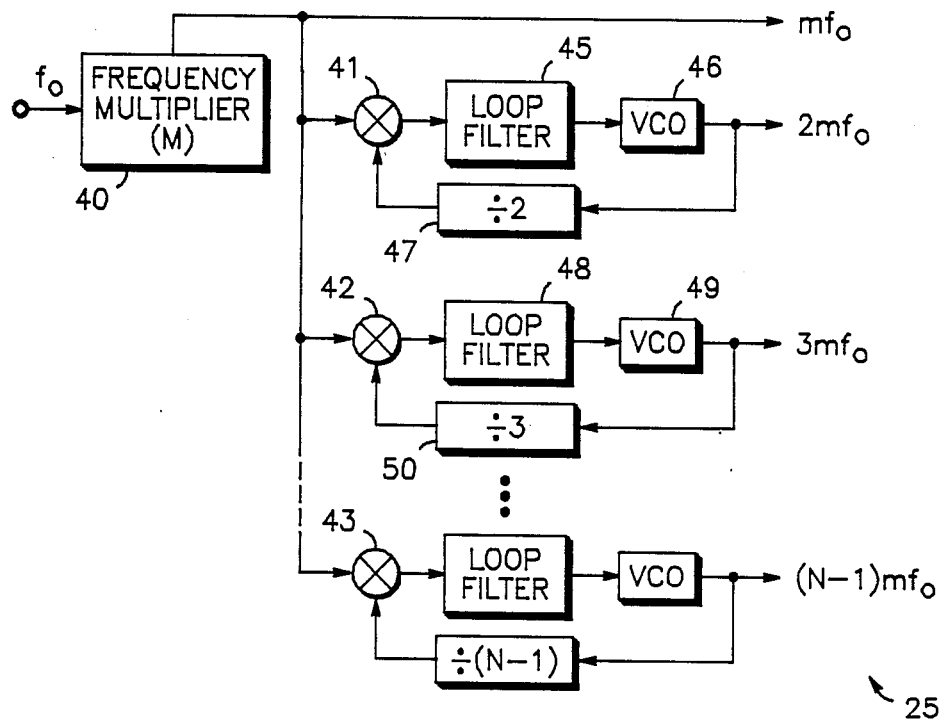
FIG. 4 is a more detailed block diagram of a portion of the block diagram illustrated in FIG. 2.

Referring specifically to FIG. 4, a more detailed block diagram of harmonic synthesizer 25 of FIG. 2 is illustrated. The fundamental frequency supplied to harmonic synthesizer 25 is applied to the input of a frequency multiplier 40. Frequency multiplier 40 multiplies the fundamental frequency by the factor m, as described above. The output of frequency multiplier 40 is the fundamental frequency multiplied by the factor m and is supplied to the clock input of filter 14 and to one input of each of phase detectors 41, 42 and 43. The output of phase detector 41 is supplied through a loop filter 45 to the control input of a voltage controlled oscillator 46. The output from oscillator 46 is 2m times the fundamental frequency, which is supplied to the clock input of filter 16 and is also supplied through a (frequency) divide by 2 circuit 47 to a second input of phase detector 41 to complete a phase locked loop. Similarly, the output of phase detector 42 is supplied through a loop filter 48 to the control input of a voltge controlled oscillator 49, the output of which is 3m times the fundamental frequency. The output of oscillator 49 is supplied to the clock input of a filter in the filter bank and through a (frequency) divide by 3 circuit 50 to a second input of phase detector 42, to complete the phase locked loop. Also, phase detector 43 is connected into a phase locked loop that supplies an output signal having a frequency $(N-1)$ m times the fundamental frequency. Thus, the fundamental frequency and a predetermined number of harmonics can be supplied by frequency synthesizer 25, which signals are reliable and stable frequencies. Many other types of frequency synthesizers may be devised by those skilled in the art and synthesizer 25 is simply disclosed because of its simplicity and stablity.

Figure 5:
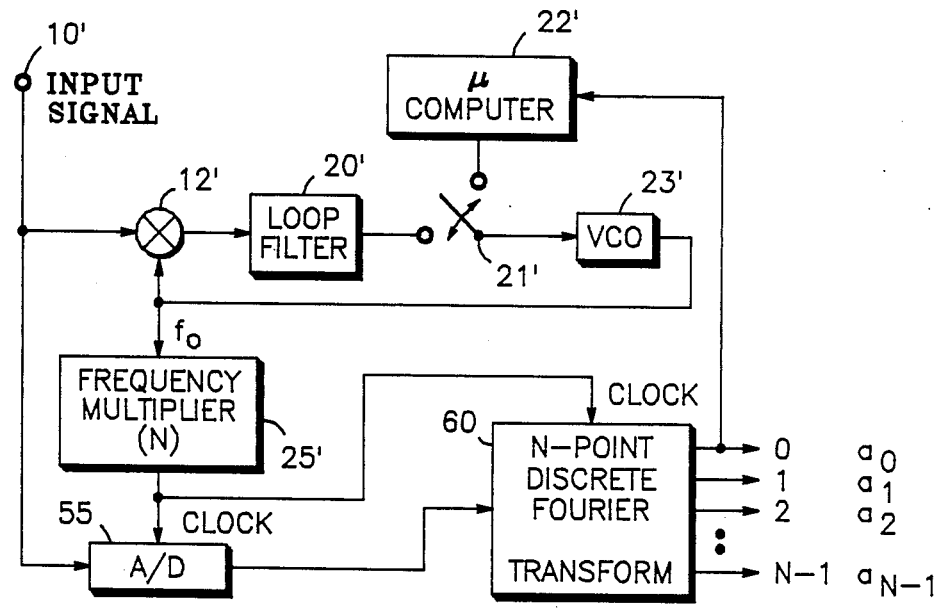
FIG. 5 is a simplified block diagram of another embodiment of a feature extractor embodying the present invention.

Referring specifically to FIG. 5, a second embodiment of a feature extractor is illustrated wherein components which are similar to those illustrated FIG. 2 are designated with a similar number having a prime added to indicate a second embodiment. Basically, in the embodiment of FIG. 5 the quasi-periodic signal applied to input terminal 10' is converted to a digital signal by analog-to-digital converter 55. The phase locked loop, consisting of phase detector 12', loop filter 20', and voltage controlled oscillator 23' performs the same function as that described in conjunction with the embodiment of FIG. 2. Further, microcomputer 22' performs the same function as microcomputer 22 in FIG. 2. The fundamental frequency output of the phase locked loop is supplied to a frequency multiplier 25' which takes the place of harmonic synthesizer 25. The output of multiplier 25' is connected to analog-to-digital converter 55 to synchronize the operation thereof. The output of multiplier 25' is also connected to an N-point discrete Fourier transform circuit 60. The operation of discrete fourier transform circuit 60 is well known in the art and will not be described in detail herein. Since circuit 60 is an N-point discrete Fourier transform it has N outputs, 0 through $N-1$, which outputs have the fundamental frequency component and $N-1$ harmonic components thereon, respectively. The digital output from converter 55 is supplied to circuit 60 and circuit 60 supplies signals at the outputs thereof which are indicative of the amplitude of the fundamental frequency and the various harmonics thereof in the quasi-periodic signal supplied to input terminal 10'.

Thus, two embodiments of a feature extractor embodying the present invention are disclosed wherein clock signals for the discrete time circuitry are derived from the signal being procesed so that the discrete time circuits always track the fundamental frequency and harmonics thereof included in the quasi-periodic signal being processed.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

What is claimed is:

1. A feature extractor comprising:
   a feature extractor signal input adapted to have a quasi-periodic signal applied thereto, said quasi-periodic signal including a fundamental frequency and harmonics thereof;
   fundamental frequency generating means connected to said feature extractor signal input for receiving a quasi-periodic signal applied thereto and generating a fundamental frequency signal therefrom;
   harmonic synthesizer means connected to said fundamental frequency generating means for receiving the generated fundamental frequency signal and providing at separate outputs the fundamental frequency signal and harmonic frequency signals equal in frequency to the harmonics of the quasi-periodic signal; and
   a plurality of clocked bandpass filters each having a signal input, a signal output and a clock input, the signal inputs of said first and second filters being connected to said feature extractor signal input, the clock input of said first filter being connected to the fundamental frequency signal output of said harmonic synthesizer means, the clock inputs of said remaining filters being connected to the corresponding harmonic frequency signal outputs of said harmonic synthesizer means, and the signal outputs of said filters providing indications of the amount of fundamental frequency and harmonic, respectively, in the received quasi-periodic signal.

2. A feature extractor as claimed in claim 1 wherein the fundamental frequency generating means includes a phase locked loop.

3. A feature extractor as claimed in claim 2 wherein the fundamental frequency generating means further includes a microcomputer connected to the signal output of the first clocked bandpass filter and to the phase locked loop for controlling said loop into search and lock modes of operation.

4. A feature extractor as claimed in claim 1 including an analog to digital converter having an input connected to the feature extractor signal input, an output connected to the signal inputs of the filters and a clock input connected to receive a clock signal from the harmonic synthesizer means.

5. A feature extractor as claimed in claim 4 wherein the clocked bandpass filters are included in a discrete Fourier transform circuit.

6. A method of determining the amplitude of a fundamental frequency and any harmonics present in a quasi-periodic signal, comprising the steps of:
   receiving the quasi-periodic signal;
   deriving the fundamental frequency from the quasi-periodic signal;
   generating predetermined harmonics from the fundamental frequency;
   providing a plurality of clocked filters;
   supplying the quasi-periodic signal to each of the filters and clocking each of the filters with a different one of the derived fundamental frequency and the generated harmonics; and
   monitoring the outputs of the filters to determine the amplitude of the fundamental frequency and the harmonics present in the quasi-periodic signal.

7. A method as claimed in claim 6 wherein a phase locked loop is utilized in the deriving step for continuously tracking the fundamental frequency during changes of the quasi-periodic signal.

8. A method as claimed in claim 7 including the step of utilizing the monitored output of the fundamental frequency filter for controlling the phase locked loop between search and lock modes of operation.

* * * * *